United States Patent
Subrahmanyam et al.

(10) Patent No.: US 9,429,247 B2
(45) Date of Patent: Aug. 30, 2016

(54) ACOUSTICALLY-MONITORED SEMICONDUCTOR SUBSTRATE PROCESSING SYSTEMS AND METHODS

(71) Applicant: Applied Materials, Inc., Santa Clara, CA (US)

(72) Inventors: Kommisetti Subrahmanyam, Singapore (SG); Todd J. Egan, Fremont, CA (US); Joseph Yudovsky, Campbell, CA (US); Michael Johnson, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 221 days.

(21) Appl. No.: 14/180,012

(22) Filed: Feb. 13, 2014

(65) Prior Publication Data

US 2014/0260624 A1  Sep. 18, 2014

Related U.S. Application Data

(60) Provisional application No. 61/779,229, filed on Mar. 13, 2013.

(51) Int. Cl.
*F16K 37/00* (2006.01)
*G01N 29/00* (2006.01)
*H01L 21/67* (2006.01)

(52) U.S. Cl.
CPC ...... *F16K 37/0083* (2013.01); *H01L 21/67253* (2013.01); *Y10T 137/8158* (2015.04)

(58) Field of Classification Search
CPC .............. H01L 21/67253; H01L 21/67109; F16K 37/0083; F16K 37/0091

USPC .................................................... 73/587, 584
See application file for complete search history.

(56) References Cited

U.S. PATENT DOCUMENTS

| | | | | |
|---|---|---|---|---|
| 5,660,528 | A | * 8/1997 | Tsunenari | F04D 33/00 417/32 |
| 2001/0051128 | A1 | * 12/2001 | Hoffman | C01B 7/0712 423/470 |
| 2004/0023606 | A1 | * 2/2004 | Wang | B24B 21/04 451/296 |

(Continued)

FOREIGN PATENT DOCUMENTS

KR  10-2008-0005956  1/2008

OTHER PUBLICATIONS

International Preliminary Report on Patentability of International Application No. PCT/US2014/016262 mailed Sep. 24, 2015.

(Continued)

*Primary Examiner* — Helen Kwok
(74) *Attorney, Agent, or Firm* — Dugan & Dugan, PC

(57) ABSTRACT

A semiconductor substrate processing system having acoustic monitoring is disclosed. The system includes a process chamber adapted to perform a process on a substrate, a process fluid source, a fluid conduit coupling the fluid source to the process chamber, and a flow control valve located along the fluid conduit and adapted to be operable to control a flow of a process fluid between the process fluid source and the process chamber. The system includes one or more acoustic sensors operable to sense acoustic noise coupled to at least one of the process fluid source, the fluid conduit, and the flow control valve, and an acoustic processor adapted to receive at least one signal from the one or more acoustic sensors. Acoustic monitoring methods are provided, as are other aspects.

20 Claims, 7 Drawing Sheets

(56) References Cited

U.S. PATENT DOCUMENTS

| | | |
|---|---|---|
| 2004/0026037 A1 | 2/2004 | Shinriki et al. |
| 2007/0224708 A1 | 9/2007 | Krishnan et al. |
| 2010/0224264 A1 | 9/2010 | Homan et al. |
| 2010/0251828 A1 | 10/2010 | Lee et al. |
| 2011/0256734 A1* | 10/2011 | Hausmann ............ C23C 16/045 438/776 |
| 2012/0109582 A1* | 5/2012 | Moriya ............. H01J 37/32935 702/183 |
| 2012/0186745 A1* | 7/2012 | Miya ................ H01J 37/32715 156/345.27 |
| 2013/0042808 A1* | 2/2013 | Sugawara ............... C23C 16/52 118/712 |
| 2013/0122782 A1 | 5/2013 | Chang et al. |
| 2013/0122788 A1 | 5/2013 | Chang et al. |

OTHER PUBLICATIONS

International Search Report and Written Opinion of International Application No. PCT/US2014/016262 mailed May 29, 2014.

Chew et al., U.S. Appl. No. 13/874,495 (20654), titled: "Apparatus and Methods for Acoustical Monitoring and Control of Through-Silicon-Via Reveal Processing," filed May 1, 2013.

* cited by examiner

ACOUSTICALLY-MONITORED SEMICONDUCTOR SUBSTRATE PROCESSING SYSTEMS AND METHODS

RELATED APPLICATIONS

The present application claims priority to U.S. Provisional Application 61/779,229 filed Mar. 13, 2013, and entitled "ACOUSTICALLY-MONITORED SEMICONDUCTOR SUBSTRATE PROCESSING SYSTEMS AND METHODS", which is hereby incorporated herein for all purposes.

FIELD

The present invention relates generally to semiconductor substrate processing, and more particularly to substrate processing systems and methods of operating the same.

BACKGROUND

Conventional electronic device manufacturing systems may include multiple process chambers, which may be distributed about a central transfer chamber, for example. These process chambers may be used to carry out processes on the substrates (e.g., patterned or unpatterned semiconductor wafers, glass panels, polymer substrates, reticules, masks, glass plates or the like) as part of semiconductor device manufacture. Many of these processes involve controlling an amount of a gas provided to the chamber as part of an etching or deposition process. Mass flow controllers and or other valves may be used in an attempt to precisely control an amount and timing of the gas supplied to the chambers. However, improper supply of the gas can cause defects or other anomalies on the substrates.

Accordingly, there is a need for a substrate processing systems and methods that enable improved precision in the control of gas delivery to the process chamber.

SUMMARY

In a first aspect, a semiconductor substrate processing system is provided. The semiconductor substrate processing system includes a process chamber adapted to carry out a process on a substrate, a process fluid source, a fluid conduit coupling the process fluid source to the process chamber, a flow control valve located along the fluid conduit and adapted to be operable to control a flow of a fluid from the process fluid source to the process chamber, and one or more acoustic sensors operable to sense acoustic noise coupled to at least one of the process fluid source, the fluid conduit, and the flow control valve, and an acoustic processor adapted to receive at least one signal from the one or more acoustic sensors.

In yet another aspect, a method of monitoring a semiconductor processing system is provided. The method includes providing a process chamber adapted to carry out a process on a substrate, a process fluid source supplying a process fluid, a fluid conduit coupling the process fluid source to the process chamber, and a flow control valve located along the fluid conduit and adapted to be operable to control a flow of the process fluid from the process fluid source to the process chamber; and monitoring acoustic noise from one or more acoustic sensors operatively coupled to at least one of: the process fluid source, the fluid conduit, and the flow control valve.

In another aspect, a semiconductor substrate processing system is provided. The semiconductor substrate processing system includes a process chamber adapted to carry out a process on a substrate, a fluid conduit providing a flow of a process fluid to the process chamber, a flow control valve located along the fluid conduit and adapted to be operable to control a flow of the process fluid to the process chamber, one or more acoustic sensors operable to sense acoustic energy coupled to at least one of the fluid conduit, and the flow control valve, and an acoustic processor adapted to receive at least one signal from the one or more acoustic sensors.

Numerous other aspects are provided in accordance with these and other embodiments of the invention. Other features and aspects of embodiments of the present invention will become more fully apparent from the following detailed description, the appended claims, and the accompanying drawings.

DESCRIPTION

Figure 1:
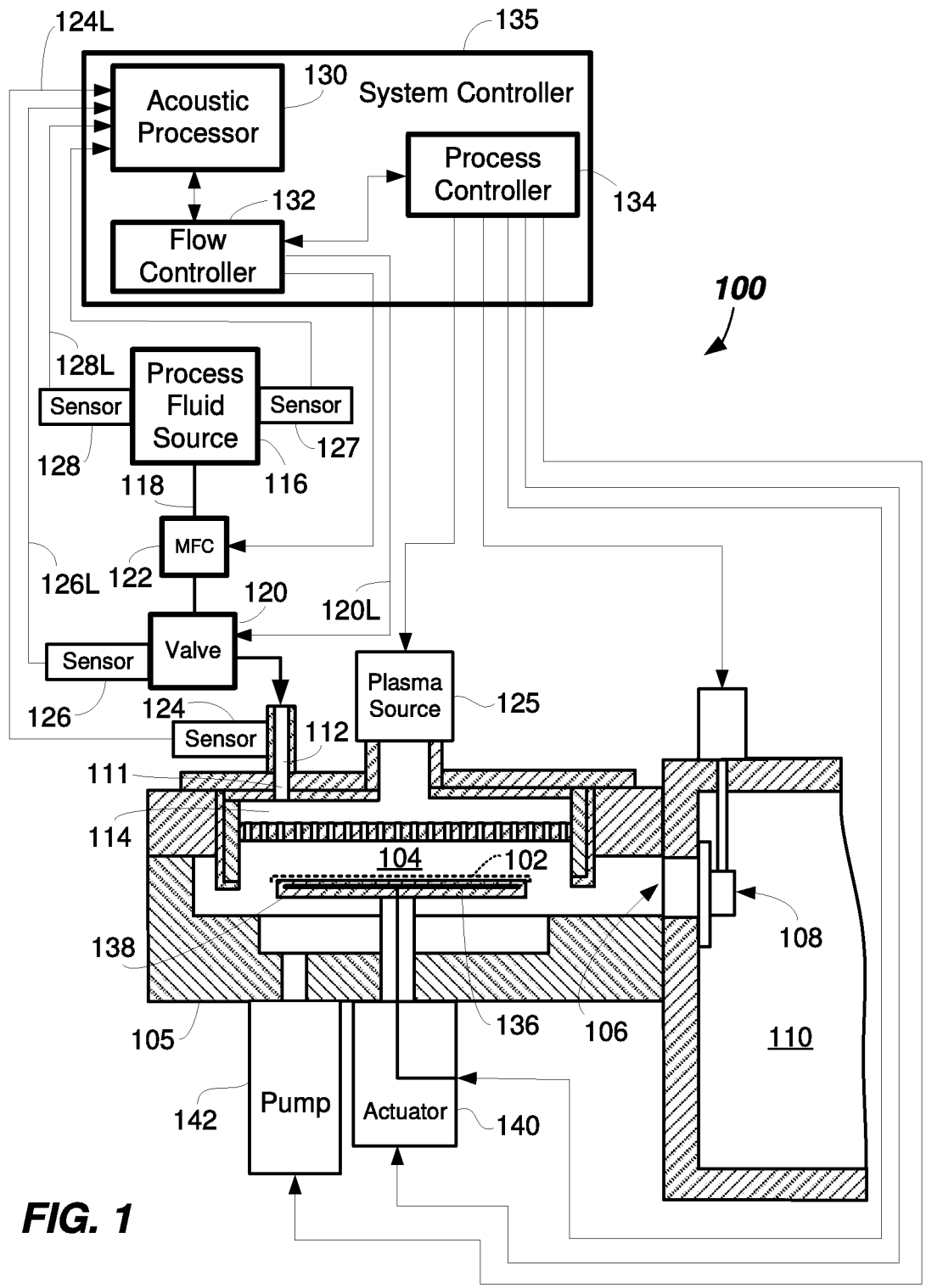
FIG. 1 illustrates a partially cross-sectioned side view of a substrate processing system including acoustic monitoring according to embodiments.

In electronic device manufacturing, it is desirable to supply fluids (gases and/or liquids) to a process chamber or chambers with a high degree of precision. In particular, gas and fluid delivery components may fail or malfunction and may have an adverse effect on the substrate (e.g., wafer) processing. For example, a sticking valve, flow path obstruction, or leak (e.g., at orifices or other flow path connection) may go undetected and impact wafer quality and/or yield.

These failures and/or malfunctions can be detected indirectly through sensors or calibration references such as mass flow verifiers (MFV), mass flow sensors, optical emission spectroscopy, residual gas analysis, but these techniques may be compromised in that they may reduce process tool availability in cases where the measurement requires dedicated access to the tool, such as in MFV, for example. Furthermore, they may not be able to isolate the source of any failure in the fluid delivery system or otherwise monitor directly at a point of interest in the fluid delivery system (e.g. there is a leak, but where is it located?). In some cases, they may not support passive monitoring in real time during the process, so problems that only occur in the course of carrying out the process may not be detected. For example, a leak check process sequence, which only looks at rate of rise in a chamber at a time other than when the process is being carried out, cannot monitor in-process leaks. Furthermore, in some aspects, monitoring may require dedicated hardware like a MFV or an Optical Emission (OE) detector, which may not available on, or easily retrofitted onto, a particular tool. Furthermore, it is desired that monitoring may be carried out directly in hostile environments (e.g. at high temperature, such as above about 70 degrees C., for example). Moreover, conventional monitoring of fluid flow may require direct communication and contact with the process fluid and potential interference with fluid flow being measured (e.g. MFCs), and may further be the source of further possible additional leaks.

Furthermore, fluid levels or properties can also vary for reasons unrelated to a component failure. Fluids can be depleted from a fluid source, such as an ampoule, for example. Moreover, precision control of fluid flows can be limited or impeded by the ability of a feedback system to measure fluid flow or fluid level.

For one or more of the foregoing reasons, an improved monitoring system and method adapted to monitor one or more aspects of fluid delivery to a process chamber adapted to carry out a process on a substrate are provided. In particular, fluid monitoring systems and methods including acoustic sensing are provided. Methods and apparatus including acoustic sensing according to embodiments of the invention can offer improved precision or more direct measurement of level and fluid flow in areas where other sensors may fail for the reasons cited above. Moreover, fluid control valve opening and closing may be monitored. Gas delivery and flow may be monitored.

Embodiments of the present invention provide systems and methods for monitoring a supply of a process fluid (a liquid or a gas, and in most cases, a gas) to a process chamber of a substrate processing system. In particular, embodiments of the present invention provide a semiconductor substrate processing system including a process chamber for carrying out a process (e.g., atomic layer deposition, etching, or the like) on a substrate, a process fluid source, a fluid conduit coupling the process fluid source to the process chamber, a flow control valve located along the fluid conduit and adapted to be operable to control a flow of a process fluid from the process fluid source to the process chamber, and one or more acoustic sensors operable to sense acoustic noise. The one or more acoustic sensors are coupled to at least one of the process fluid source, the fluid conduit, and the flow control valve, and may be coupled to all three or a subset thereof in some embodiments. An acoustic processor is adapted to receive at least one signal from the one or more acoustic sensors. The acoustic processor may be operational to verify proper operation and may diagnose various system failures, such as low liquid levels in bubblers, systems leaks from various conduits and connections, improper flow rates, stuck or sticking valves, and the like.

These and other embodiments of systems and methods including acoustic monitoring are described below with reference to FIGS. 1-9. The drawings are not necessarily drawn to scale. Like reference numerals are used throughout the specification to denote like elements.

Referring now in specific detail to FIG. 1, a semiconductor substrate processing system 100, which may be used for performing a process on a substrate 102 (patterned or unpatterned semiconductor wafers, glass panels, polymer substrates, reticules, masks, glass plates, and the like) according to embodiments of the present invention is shown. The semiconductor substrate processing system 100 includes a process chamber 104 adapted to receive the substrate 102 to be processed. The process chamber 104 may be formed in a body 105, which may include an opening 106 having a slit valve 108 operable with the opening to close off and/or seal the process chamber 104. The opening 106 and slit valve 108 are provided in order to pass substrates 102 into and out of the process chamber 104 from a transfer chamber 110 before and after processing. Any number of processes may take place on the substrate 102 (e.g., substrate 102) within the process chamber 104, such as deposition, etching, oxidation, nitration, or the like. Other processes may be carried out therein.

In more detail, the process chamber 104 may be serviced by the robot (not shown) whereby substrate 102 may be put to and picked from the process chamber 104. As should be recognized, more than one process chamber may be coupled to the transfer chamber 110 and each may include a substrate (like substrate 102) that is adapted to undergo a process therein. Process chamber 104 may include a fluid inlet 111 adapted to supply a process fluid 114 into the process chamber 104. Process fluid 114 may include a gas or a liquid. In particular, in some embodiments, the process fluid 114 may be a gas such as $Cl_2$, $ClF_3$, $C_2F_6$, $CHF_3$, $SiH_4$, Argon, Helium, Nitrogen, Hydrogen, combinations of the aforementioned, and the like. Other gas types may be delivered. Fluid inlet 111 is fluidly coupled to a process fluid source 116. The process fluid source 116 may be a bubbler, a pressurized vessel, or the like. The fluid coupling may be by a fluid conduit 118 coupling the process fluid source 116 to the process chamber 104. Located along the fluid conduit 118 and adapted to be operable to control a flow of the process fluid 114 from the process fluid source 116 to the process chamber 104 is a flow control valve 120. Flow control valve 120 may be a two-position valve, for example. Flow rate may be controlled by a mass flow controller (MFC) 122 also provided in the flow path between the process fluid source 116 and the process chamber 104, and generally provided upstream of the flow control valve 120. Any suitable conventional mass flow controller 122 may be used.

One or more acoustic sensors 124, 126, 128 operable to sense acoustic energy coupled to a process fluid flow component. One or more acoustic sensors may be physically coupled to at least one of the fluid conduit 118 (e.g., acoustic sensor 124), the flow control valve (e.g., acoustic sensor 126), or the process fluid source (e.g., acoustic sensor 128). In some embodiments, acoustic sensors may be coupled to more than one process fluid flow component, such as to the fluid conduit 118 (e.g., acoustic sensor 124) and the flow control valve 120 (e.g., acoustic sensor 126). In other embodiments, the acoustic sensors may be coupled to three or more process fluid flow components, such as the fluid conduit 118 (e.g., acoustic sensor 124), the flow control valve 120 (e.g., acoustic sensor 124), and the process fluid source 116 (e.g., acoustic sensor 128).

The semiconductor substrate processing system 100 also includes an acoustic processor 130 adapted to receive at least one signal from the one or more acoustic sensors (e.g., acoustic sensors 124, 126, 128). Signals may comprise electrical signals carried in electrical lines 124L, 126L, 128L whose intensity may vary over time. The acoustic processor 130 is adapted to receive the time-varying signals which are correlated to acoustic energy and process the signals. The acoustic processor 130 may include suitable filtering, amplifying, and conversion (e.g., A/D converting) electrical components and may include a suitable processor and memory adapted to store data and carry out processing of the data.

In one or more embodiments, this processing involves receiving the signals correlated to acoustic energy at the acoustic processor 130 and comparing the amplitude thereof against one or more thresholds and/or threshold bands. In some embodiments, processing may involve receiving the signals correlated to acoustic energy and comparing certain aspects or areas of the acoustic energy trace over time to preset thresholds. The collected data and analysis may be stored, for example, in any suitable storage medium (e.g. RAM, ROM or other memory) of the acoustic processor 130. This stored analysis and data may be used to monitor system fluid delivery performance over time by monitoring acoustic energy at one or more locations. Monitoring may involve signaling a warning if one or more thresholds are exceeded. The warning may be displayed on a visual display coupled to the system controller 135 or may be audible, for example.

The semiconductor substrate processing system 100 may include a flow controller 132, which includes electrical components and circuitry adapted to cause control adjustments in the flow rate and delivery of the process fluid 114. For example, the flow controller 132 may adjust the flow through a mass flow controller 122, as well as controlling the operation of the flow control valve 120. The semiconductor substrate processing system 100 may also include a process controller 134 that is adapted to control the overall processing that is taking place in the process chamber 104. For example, the process controller 134 may control plasma generation by a remote or other plasma source 125, control of a heater 136 provided in or on the pedestal 138, opening and closing of a slit valve 108, controlling a pedestal lift actuator 140, or controlling a turbo pump 142. Other process functions may be controlled, as well. All of these functions may be embodied in a common system controller 135 in some embodiments. For example, all functions (acoustic processing, flow control processing, and process control) may be accomplished by a common processor and memory. Optionally, separate controllers may be used, which may communicate with one another. The various functions may be synchronized to the extent desired to monitor and control proper system operation.

Figure 2:
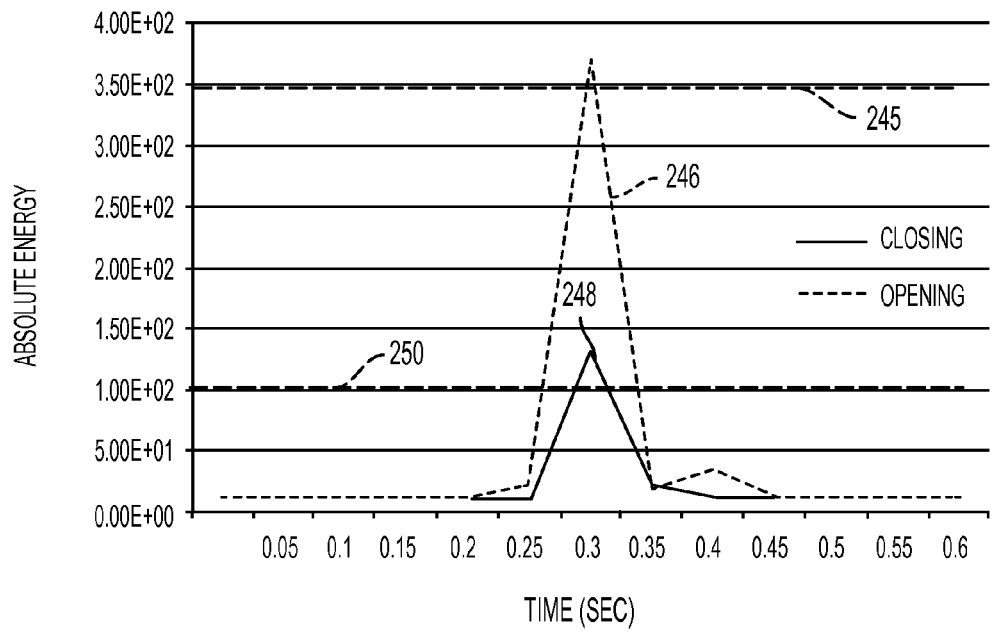
FIG. 2 illustrates acoustical traces of absolute acoustical emission energy versus time for both opening and closing of a fluid control valve according to embodiments.

The detailed structure and operation of the acoustic monitoring semiconductor substrate processing system 100 will now be described in more detail with reference to FIGS. 1-8. In a first aspect, as shown in FIG. 2, the absolute energy of the flow control valve 120 (FIG. 1) may be monitored. The signal correlated to acoustic energy in line 126L may be processed as a function of time and absolute energy may be determined therefrom. The absolute emission energy may be determined by the following method. The signals in lines 124L, 126L, 128L may be captured by sampling electronics in the acoustic processor 130 using 1 Mhz sample rate, for example. Other sampling rates may be used. Depending upon the type of material that the acoustic sensors 124, 126, 128 are in contact with, some adjustment a coefficient factor may be accomplished. The factor varies for, metals, plastics, or the like and is predefined and described by the sensor supplier. The incoming signals in lines 124L, 126L, 128L may be appropriately filtered. For example, to minimize noise, a band pass filter may be used having a band pass between about 10 Khz and about 450 Khz. The filter settings may depend on the particular application and signal-to-noise ratio of the particular signal. Filtering may be accomplished in hardware or software.

Once the one or more supplied signals are filtered, e.g., using band pass filter, the absolute energy is calculated using a time constant. Some parameters, such as absolute energy, or even spectral density at particular frequency band are calculated for the time constant. In the depicted embodiments, a time constant of 50 ms was applied. Other time constants may be determined experimentally, and depend on the particular application and response behavior.

A quantifiable measurement of the absolute energy contained in the one or more signals may be derived as a mathematical integral of a modification of the voltage signal. For example, the absolute energy may be calculated as an integral of the squared voltage of the signal over the time constant selected (e.g., time constant of 50 ms). Other energy calculations or estimates may be used. The above calculation is useful to identify a condition of a particular component being monitored. In other embodiment, such as when trying to identify a particular mode of failure of a component (e.g., a flow control valve) a wavelet analysis may be applied to the observed acoustic energy within one or more frequency bands.

The one or more instantaneous values of the absolute acoustic energy may then be compared to one or more preset thresholds, such as energy threshold 245. The acoustic sensor 124 is coupled (acoustically coupled so that noise thereof may be monitored) to flow control valve 120 and the acoustic processor 130 may determine an opening and closing of the flow control valve 120 based upon measured acoustic emission energy.

FIG. 2 illustrates the energy of opening (trace 246) and closing (trace 248) the flow control valve 120 at a specific time after receiving a triggering signal. As can be seen, the traces differ from one another and are distinguishable in terms of both shape and magnitude and features that are acoustically measurable. For example, in one embodiment, the opening of the flow control valve 120 may be monitored, and a malfunction thereof may be determined. In particular, if a magnitude of the threshold 245 is not exceeded within a predefined period of time from a triggering signal (adapted to initiate valve opening), then a valve malfunction warning may be flagged. Similarly, the closing of the flow control valve 120 may be acoustically monitored. A malfunction during closing may be determined if a magnitude of a closing threshold 250 is not exceeded within a predefined period of time from a valve triggering signal. If a malfunction is noted, then a valve malfunction warning may be flagged. Thus, the acoustic processor 130 may verify both an opening and a closing of the flow control valve 120 based upon comparing the measured acoustic emission energy to one or more preset acoustic energy thresholds 245, 250. Moreover, the acoustic processor 130 may verify opening and closing of the flow control valve 120 based upon comparing a time to exceed the preset acoustic energy thresholds 245, 250 to preset opening and closing time thresholds. In addition to these thresholds or in substitution thereof, one or more of the shape of one or more of the traces 246, 248, a slope of the traces 246, 248 at one or more portions of the traces, or combinations thereof may be used.

Figure 3:
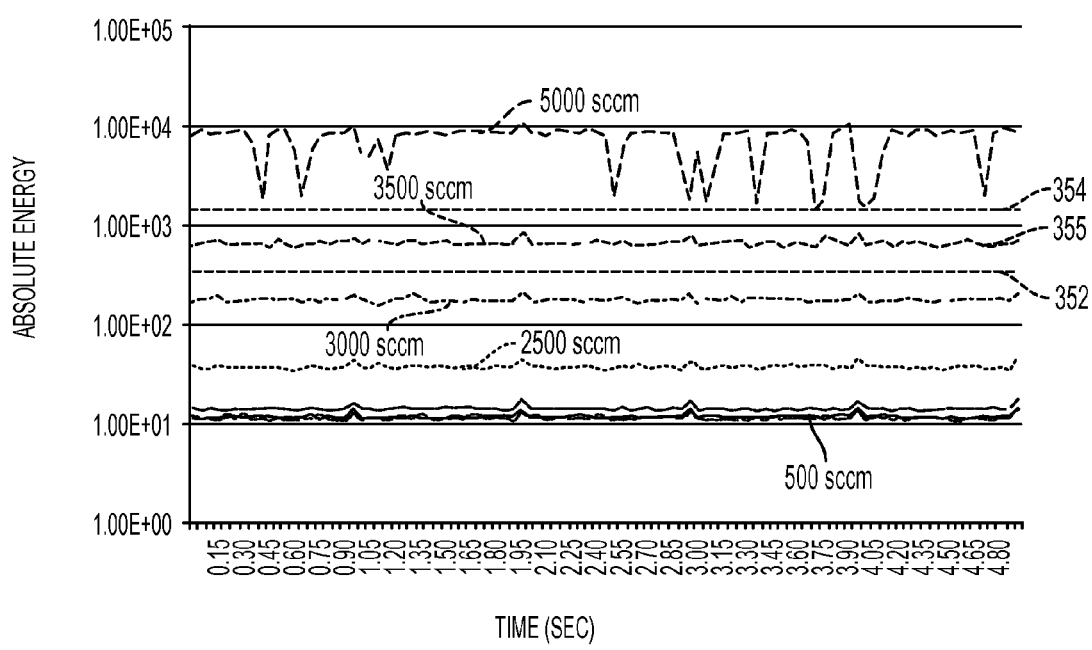
FIG. 3 illustrates acoustical traces of absolute acoustical emission energy versus time for various fluid flow rates (e.g., 500 sccm to 5000 sccm) of the substrate processing system according to embodiments.

In another aspect, the semiconductor substrate processing system 100 the acoustic sensor 124 is coupled to a fluid conduit 112. Acoustic processor 130 may then determine a fluid flow velocity (flow rate) based upon monitoring the measured acoustic emission energy over time. In particular, the acoustic processor 130 is operable to compare the measured absolute emission energy to a threshold range to verify and expected flow rate. For example, FIG. 3 illustrates measured absolute energy versus time for several different flow rates of the process fluid 114 through the fluid conduit 118. Flow rates may be monitored and verified based upon comparing measured absolute emission energy of a particular flow condition against expected threshold values. For example, lower and upper thresholds 352, 354 may define a threshold range that may be set in comparator software executed by the acoustic processor 130, and an acoustic trace 355 having a value that falls within the threshold range may be determined to be a proper setting, while a value outside of that range may be flagged as a flow malfunction of the mass flow controller 122, the valve 120 or a leak in the system 100, for example. Single ranges or multiple ranges may be set to verify one or a multitude of flow rates of the process fluid 114.

Figure 4:
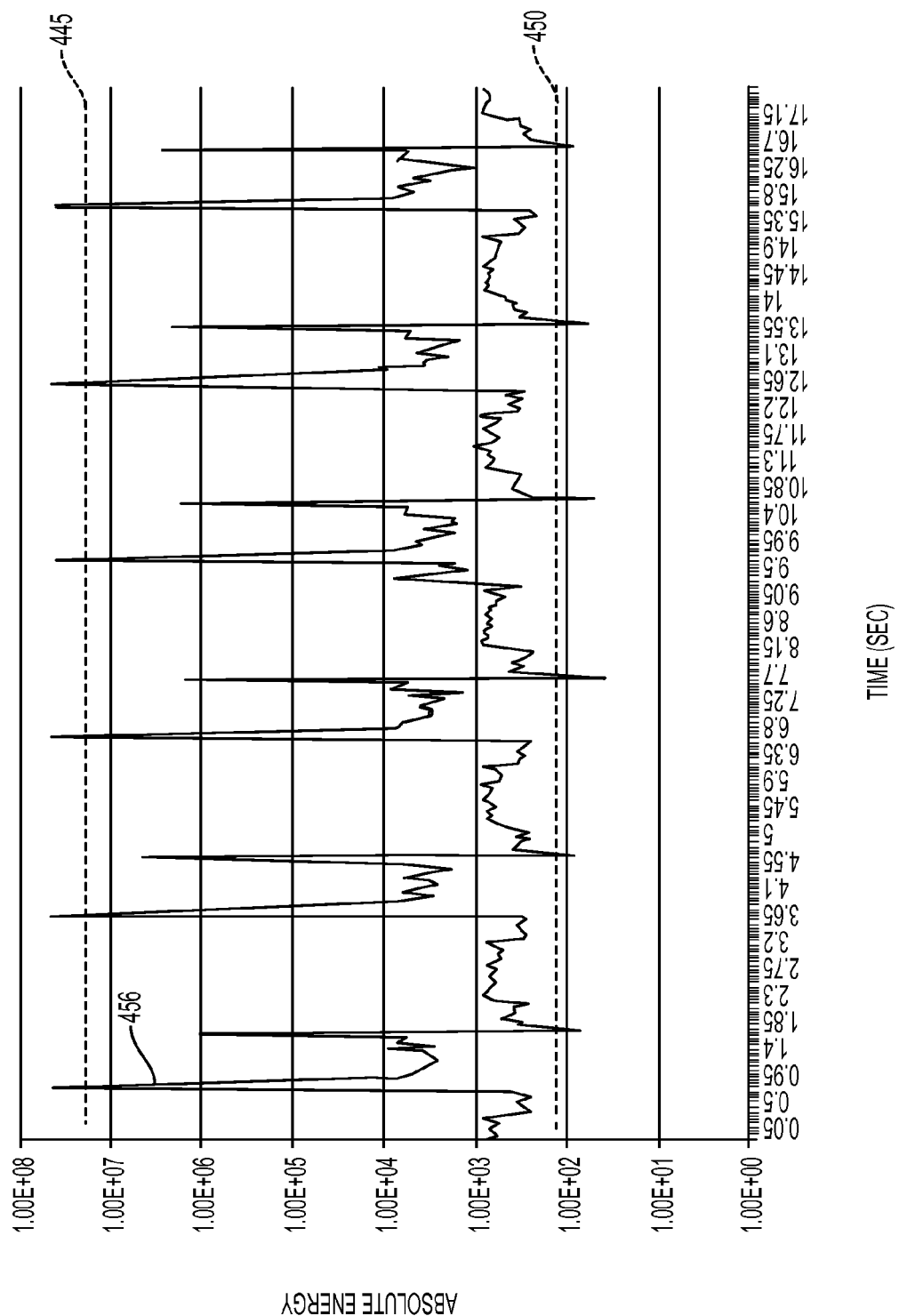
FIG. 4 illustrates an acoustical trace of absolute acoustical emission energy versus time for six cycles of repeated opening and closing of a fluid control valve according to embodiments.
Figure 6:
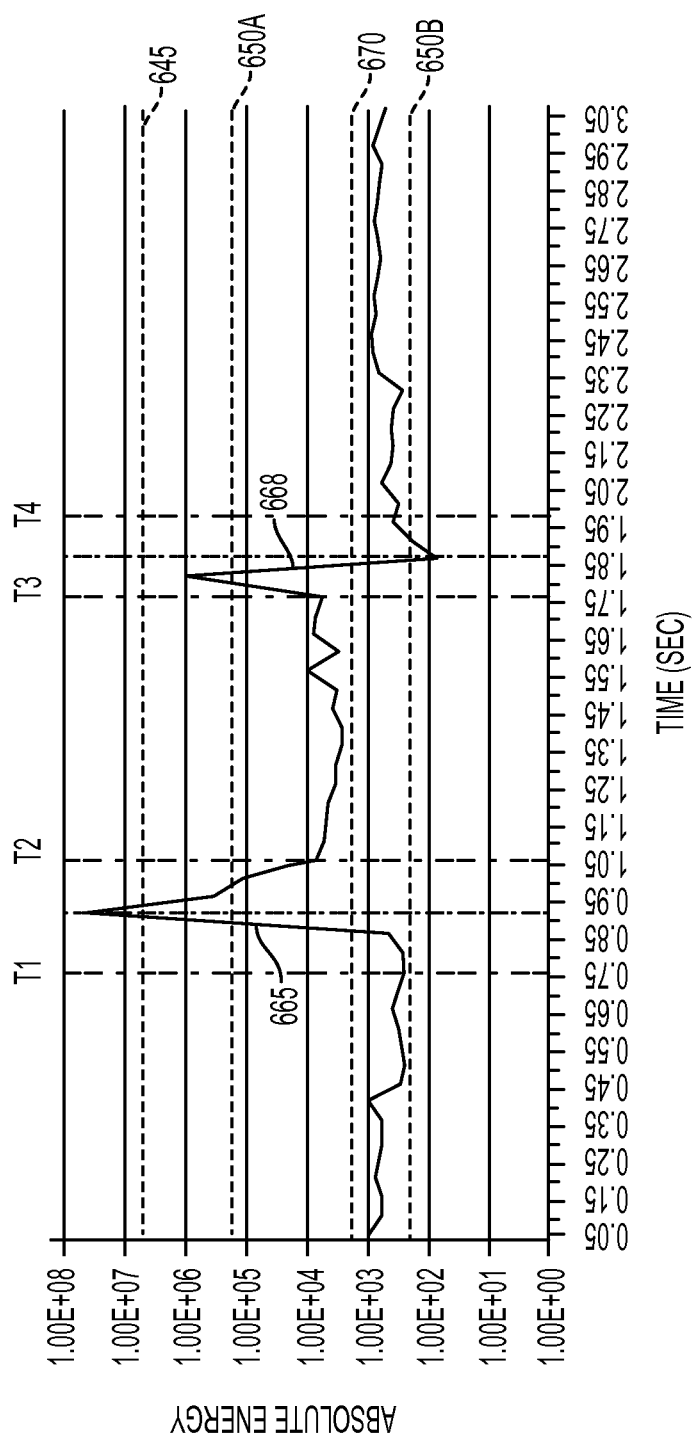
FIG. 6 illustrates an acoustic trace of a single opening and closing event of a fluid control valve responsive to the trigger signal according to embodiments.

FIG. 4 illustrates a trace 456 over time of an opening and closing of a flow control valve 120, and illustrates that an opening threshold and a closing threshold may be set. This allows the operation of the fluid control valve 120 to be monitored over time. For example, FIG. 6 illustrates a single opening and closing cycle of an example flow control valve 120. Various amplitude thresholds (dotted horizontal lines) and time thresholds (dotted vertical lines) are shown for illustration. As the valve 120 is opened via a control (trigger) signal from the flow controller 132 in line 120L, the acoustic sensor 126 monitors the acoustic energy over time and produces a time varying signal. The flow controller 132 is operational to communicate the trigger signal to the acoustic processor 130.

Figure 5:
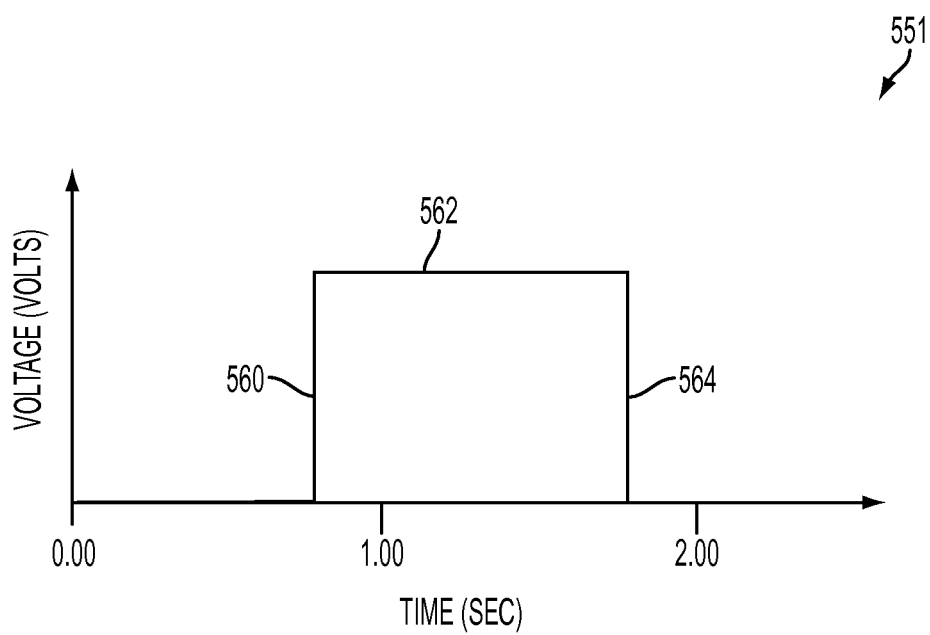
FIG. 5 illustrates a trigger signal to initiate opening and closing of a fluid control valve according to embodiments.

A control (triggering) signal 551 is shown in FIG. 5 and includes a first triggering side 560 where the voltage (or current) applied to the flow control valve 120 ramps from a lower level to a higher level in a very short time duration, a constant portion 562 where the applied voltage remains at an approximately constant level, and a closing edge 564 where the applied voltage drops back to the lower level, which may be a zero voltage condition. The first triggering side 560 of the control signal 551 triggers the opening of the fluid control valve 120 at time T1. The acoustic sensor 124 continuously senses acoustic energy and passes an acoustic signal to the acoustic processor 130. If a preset energy threshold 645 is not exceeded by time T2, then this may be indicative of a valve malfunction.

Optionally, the slope of the uprising portion 665 of the trace may be determined, on average, by taking the difference between an amplitude of the Absolute Energy at T1 (i.e., at the triggering edge 560 of the control signal 551) and the Absolute Energy at a time when the preset energy threshold 645 is exceeded and dividing that by the difference in time from T1 until the time when the threshold is exceeded. A slope threshold may be set wherein if the slope threshold is exceeded, thus indicating taking too long for the valve to open, a valve malfunction may be flagged. Similar threshold functions may be established for valve closing.

In particular, at time T3 (corresponding to closing edge 564), the valve closing is initiated by the control (triggering) signal 551. Normally, an acoustic trace profile will be established at closing that may be monitored. Whether the absolute energy measured exceeds one or more thresholds (e.g., thresholds 650A, 650B) may be monitored to determine proper operation and closing. Should the closing take too long, or the valve 120 were to become stuck open, then the threshold 650B may not be exceeded by a time T4. Slope of the downward portion 668 of the closing trace may also be monitored to determine proper closing of the valve 120 in the same manner as the slope of the opening trace 665. In addition, or in the alternative, other portions of the acoustic energy trace may be measured and compared against one or more thresholds.

For example, the steady state absolute energy condition between the valve opening and closing may be monitored. For example, an average energy level between times T2 and T3 may be monitored and compared to a steady state threshold 670. This may be monitored to ensure the valve 120 is properly opened and that the fluid flow rate of the process fluid 114 through the valve 120 is sufficient. An upper threshold (not shown) may be used, as well. This may ensure that a flow rate is not too high. Likewise, one or more thresholds may be used to monitor that the valve 120 remains closed.

For example, during the time between T4 and the start of the next valve opening cycle, a steady state acoustic energy may be monitored against a threshold (e.g., like threshold 670) to determine that the acoustic energy of the flow control valve 120 is sufficiently low to indicate valve closure (e.g., low or substantially no flow). Other portions of the trace may be monitored, measured, and compared against one or more preset thresholds or against stored patterns to determine and verify proper valve function or valve aging thereby allowing maintenance at the proper intervals, and/or valve failure.

In another aspect, the acoustic sensor 128 may be coupled to the process fluid source 116. The acoustic sensor 128 coupled to the process fluid source 116 monitors acoustic energy emanating from the process fluid source 116 such that the acoustic processor 130 may determine a fluid level of the process fluid source 116 based upon monitoring the measured acoustic emission energy. In some embodiments, an acoustic generator 127, such as a vibrating mass or speaker may be coupled to the process fluid source 116 and excite the space within the process fluid source 116, such as by performing a frequency sweep including an acoustic resonance, and the response of the space in the process fluid source 116 may be measured and used to determine a fluid level in a container of the process fluid source 116.

Thus, the system 100 is capable of monitoring acoustic energy from one or more acoustic sensors 124, 126, 128 operatively coupled to at least one of the process fluid source 116, the fluid conduit 112, and the flow control valve 120.

Figure 7:
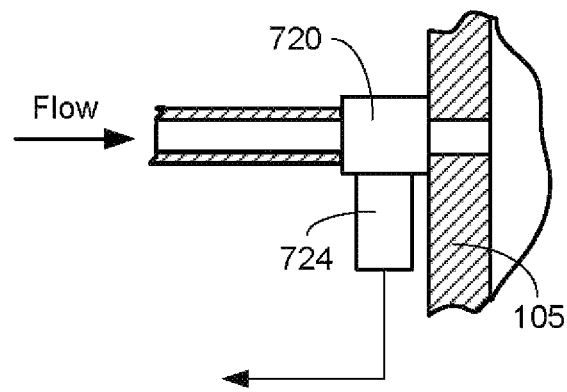
FIG. 7 illustrates a partially cross-sectioned partial side view of an acoustic sensor coupled to a fluid control valve according to embodiments.

FIG. 7 illustrates another embodiment, where the acoustic sensor 724 is positioned downstream of the MFC, but where the flow control valve 720 is coupled directly to the body 105 containing the process chamber 104. In this manner, both fluid flow (e.g., gas flow) and valve opening and closing may be monitored at a common position that is directly adjacent to the process chamber 104.

Figure 8:
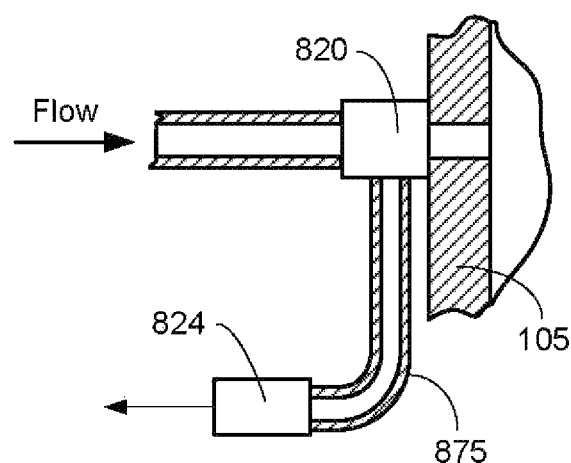
FIG. 8 illustrates a partially cross-sectioned partial side view of an acoustic sensor remotely coupled to a fluid control valve by a waveguide according to embodiments.

FIG. 8 illustrates another embodiment, where the acoustic sensor 824 is positioned away from the fluid flow valve 820 and a waveguide 875 comprising an airway or passageway is used to carry the acoustic energy from the flow control valve 820 to acoustic sensor 824, which may then be positioned at a location of lower temperature than the flow control valve 820.

Figure 9:
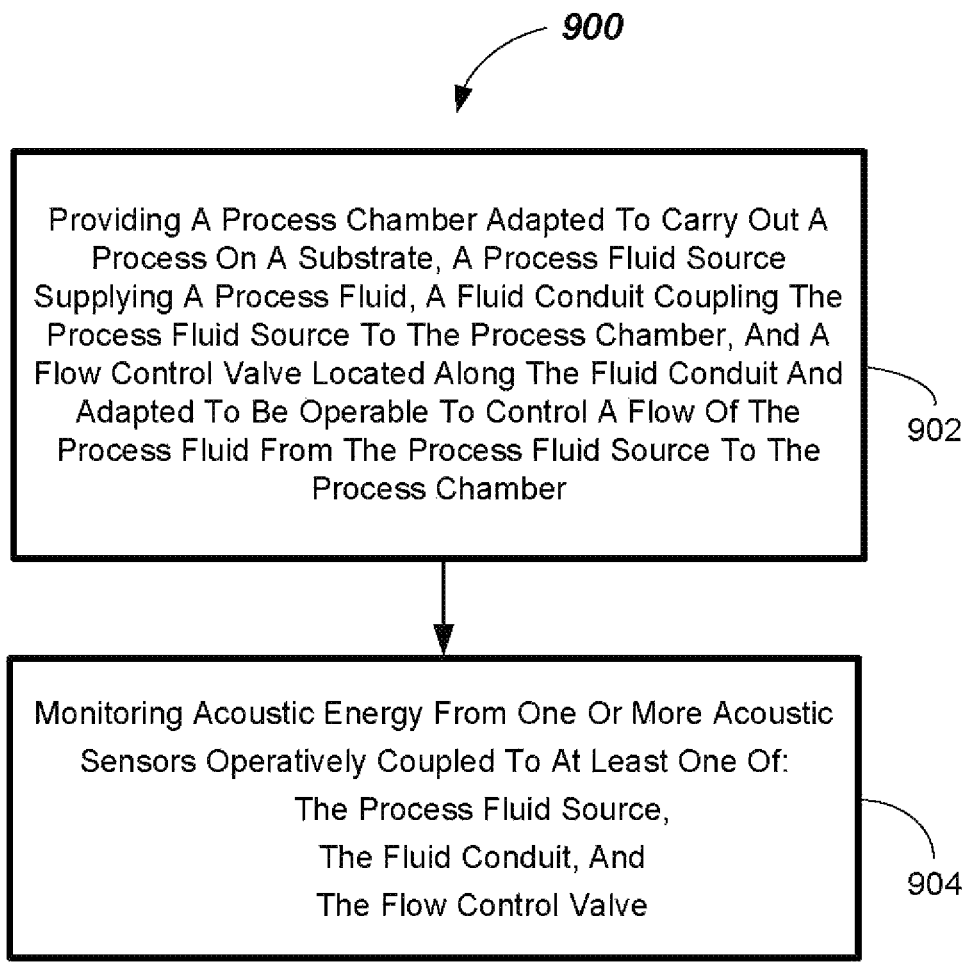
FIG. 9 illustrates a flowchart depicting a method of monitoring a semiconductor processing system according to embodiments.

The flowchart shown in FIG. 9 illustrates a method 900 of monitoring a semiconductor processing system 100 according to one or more embodiments. The method 900 includes, in 902, providing a process chamber (e.g., process chamber 104) adapted to carry out a process (e.g., deposition process, etching process, abatement process, cleaning process, and the like) on a substrate (e.g., substrate 102), a process fluid source (e.g., process fluid source 116) supplying a process fluid (e.g., process fluid 114), a fluid conduit (fluid conduit 118) coupling the process fluid source to the process chamber, and a flow control valve (e.g., flow control valve 120, 720, 820) located along the fluid conduit and adapted to be operable to control a flow of the process fluid from the process fluid source to the process chamber.

The method 900 further includes, in 904, monitoring acoustic energy from one or more acoustic sensors (e.g., acoustic sensor 124, 126. 128, 724, or 824) operatively coupled to at least one of the process fluid source, the fluid conduit, and the flow control valve.

The method 900 monitors acoustic emission energy by operation of the acoustic processor 130 that is adapted to receive at least one signal from the one or more acoustic sensors (124, 126, 128, 724 or 824). As discussed above, the method monitors the acoustic emission energy to determine opening and closing of the flow control valve 120 in one or more embodiments, verify a flow rate of the process fluid (process fluid 114) in one or more embodiments, and/or verify a fluid level of the process fluid in the process fluid source (e.g., process fluid source 116).

In the case of flow control valve monitoring, acoustic emission energy, as plotted in FIG. 4, is monitored by comparing a magnitude of measured absolute energy of the acoustic emission energy to one or more predetermined threshold values (e.g., thresholds 445, 450). In accordance with another aspect, as shown in FIG. 6, a time (between times T1 and T2) to exceed a predetermined threshold value (e.g., preset energy threshold 645) is determined. In some embodiments, a time from a trigger signal (e.g., at T1) to a time to exceed a predetermined threshold value (e.g., preset energy threshold 645) is determined and compared to a time threshold. Accordingly, an opening time and/or a closing time of a flow control valve 120, or both, may be determined from the measured acoustic emission energy.

While embodiments of the invention are susceptible to various modifications and alternative forms, specific embodiments and methods thereof have been shown by way of example in the drawings and are described in detail herein. It should be understood, however, that it is not intended to limit the invention to the particular apparatus, systems, or methods disclosed, but, to the contrary, the intention is to cover all modifications, equivalents, and alternatives falling within the scope of the invention.

The invention claimed is:

1. A semiconductor substrate processing system, comprising:
    a process chamber adapted to carry out a process on a substrate;
    a process fluid source;
    a fluid conduit coupling the process fluid source to the process chamber;
    a flow control valve located along the fluid conduit and adapted to be operable to control a flow of a process fluid from the process fluid source to the process chamber;
    one or more acoustic sensors operable to sense acoustic energy coupled to at least one of:
        the process fluid source,
        the fluid conduit, and
        the flow control valve; and
    an acoustic processor adapted to receive at least one signal from the one or more acoustic sensors.

2. The semiconductor substrate processing system of claim 1 wherein the one or more acoustic sensors is coupled to the flow control valve and the acoustic processor determines opening and closing of the flow control valve based upon measured acoustic emission energy.

3. The semiconductor substrate processing system of claim 2 wherein the acoustic processor verifies opening and closing of the flow control valve based upon comparing the measured acoustic emission energy to preset acoustic energy thresholds.

4. The semiconductor substrate processing system of claim 3 wherein the acoustic processor verifies opening and closing of the flow control valve based upon comparing a time to exceed the preset acoustic energy thresholds to preset opening and closing time thresholds.

5. The semiconductor substrate processing system of claim 2 wherein the one or more acoustic sensors is coupled to the fluid conduit and the acoustic processor determines a fluid flow velocity based upon monitoring the measured acoustic emission energy over time.

6. The semiconductor substrate processing system of claim 2 wherein the acoustic processor is operable to compare the measured emission energy to a threshold range to verify an expected flow rate.

7. The semiconductor substrate processing system of claim 1 comprising:
    a flow controller adapted to control the flow control valve, the flow controller operational to communicate a trigger signal to the acoustic processor.

8. The semiconductor substrate processing system of claim 1 wherein the one or more acoustic sensors is coupled to the process fluid source and the acoustic processor determines a fluid level of the process fluid source based upon monitoring the measured acoustic emission energy.

9. The semiconductor substrate processing system of claim 1 further comprising a waveguide coupled to the one or more acoustic sensors.

10. The semiconductor substrate processing system of claim 1 further comprising an acoustic generator coupled to the process fluid source.

11. A method of monitoring a semiconductor processing system, comprising:
    providing a process chamber adapted to carry out a process on a substrate, a process fluid source supplying a process fluid, a fluid conduit coupling the process fluid source to the process chamber, and a flow control valve located along the fluid conduit and adapted to be operable to control a flow of the process fluid from the process fluid source to the process chamber; and
    monitoring acoustic energy from one or more acoustic sensors operatively coupled to at least one of:
        the process fluid source,
        the fluid conduit, and
        the flow control valve.

12. The method of claim 11, wherein the acoustic energy is monitored by an acoustic processor adapted to receive at least one signal from the one or more acoustic sensors.

13. The method of claim 12 wherein the acoustic energy that is monitored comprises acoustic emission energy.

14. The method of claim 13, wherein the acoustic emission energy is monitored to determine opening and closing of the flow control valve.

15. The method of claim 13, wherein the acoustic emission energy is monitored to verify a flow rate of the process fluid.

16. The method of claim 13, wherein the acoustic emission energy is monitored to verify a fluid level of the process fluid.

17. The method of claim 13, wherein the acoustic emission energy is monitored by comparing a magnitude of measured absolute energy of the acoustic emission energy to a predetermined threshold value.

18. The method of claim 17, wherein a time to exceed the predetermined threshold value is determined.

19. The method of claim 17, wherein a time from a trigger signal to a time to exceed the predetermined threshold value is determined and compared to a time threshold.

20. A semiconductor substrate processing system, comprising:
- a process chamber adapted to carry out a process on a substrate;
- a fluid conduit providing a flow of a process fluid to the process chamber;
- a flow control valve located along the fluid conduit and adapted to be operable to control a flow of the process fluid to the process chamber;
- one or more acoustic sensors operable to sense acoustic energy coupled to at least one of:
  - the fluid conduit, and
  - the flow control valve; and
- an acoustic processor adapted to receive at least one signal from the one or more acoustic sensors.

* * * * *